US011562920B2

(12) United States Patent
Steeman

(10) Patent No.: US 11,562,920 B2
(45) Date of Patent: Jan. 24, 2023

(54) SEMI-CONDUCTOR WAFERS LONGER THAN INDUSTRY STANDARD SQUARE

(71) Applicant: 1366 TECHNOLOGIES, INC., Bedford, MA (US)

(72) Inventor: Robertus Antonius Steeman, Littleton, MA (US)

(73) Assignee: CUBICPV INC., Bedford, MA (US)

(*) Notice: Subject to any disclaimer, the term of this patent is extended or adjusted under 35 U.S.C. 154(b) by 190 days.

(21) Appl. No.: 16/757,497

(22) PCT Filed: Oct. 23, 2018

(86) PCT No.: PCT/US2018/057031
§ 371 (c)(1),
(2) Date: Apr. 20, 2020

(87) PCT Pub. No.: WO2019/083956
PCT Pub. Date: May 2, 2019

(65) Prior Publication Data
US 2020/0251355 A1    Aug. 6, 2020

Related U.S. Application Data

(60) Provisional application No. 62/576,143, filed on Oct. 24, 2017.

(51) Int. Cl.
*H01L 21/67* (2006.01)
*H01L 21/673* (2006.01)
(Continued)

(52) U.S. Cl.
CPC .......... *H01L 21/6734* (2013.01); *B65G 47/90* (2013.01); *H01L 21/67313* (2013.01);
(Continued)

(58) Field of Classification Search
CPC .......... H01L 21/6734; H01L 21/67313; H01L 21/67706; H01L 31/035281;
(Continued)

(56) References Cited

U.S. PATENT DOCUMENTS

| 4,834,805 A * | 5/1989 | Erbert ................. G02B 3/0075 136/246 |
| 2008/0223429 A1* | 9/2008 | Everett ............... H01L 31/0516 136/246 |

(Continued)

FOREIGN PATENT DOCUMENTS

| WO | WO2012101947 A1 | 8/2012 |
| WO | WO 2015/158390 A1 | 10/2015 |
| WO | WO2016110970 A1 | 7/2016 |

OTHER PUBLICATIONS

Notification Concerning Transmittal of International Preliminary Report on Patentability for International Patent Application No. PCT/US2018/057031, dated May 7, 2020, 7 pages.
(Continued)

*Primary Examiner* — Mohammed Shamsuzzaman
(74) *Attorney, Agent, or Firm* — The Marbury Law Group PLLC

(57) ABSTRACT

A semiconductor wafer is as wide as the industry standard width A (presently 156 mm+/−1 mm) and is longer than the industry standard A by at least 1 mm and as much as the standard equipment can reasonably accommodate, presently approximately 3-20 mm and potentially longer, thus, gaining significant additional surface area for sunlight absorption. Modules may be composed of a plurality of such larger wafers. Such wafers can be processed in conventional processing equipment that has a wafer retaining portion of industry standard size A and a configuration that also accommodates a wafer with a perpendicular second edge longer
(Continued)

than A by at least 1 and typically 3-20 mm. Wet bench carriers and transport and inspection stations can be so used.

8 Claims, 10 Drawing Sheets

(51) Int. Cl.
    *B65G 47/90*     (2006.01)
    *H01L 21/677*     (2006.01)
    *H01L 31/0352*     (2006.01)
    *H01L 31/18*     (2006.01)

(52) U.S. Cl.
    CPC ............... *H01L 21/67706* (2013.01); *H01L 31/035281* (2013.01); *H01L 31/1876* (2013.01)

(58) Field of Classification Search
    CPC ........... H01L 31/1876; H01L 21/67353; H01L 21/67373; H01L 31/042; H01L 31/1804; B65G 47/90; Y02E 10/547; Y02P 70/50
    See application file for complete search history.

(56) References Cited

U.S. PATENT DOCUMENTS

| | | | | |
|---|---|---|---|---|
| 2009/0152162 | A1* | 6/2009 | Tian | H01L 21/67353 206/710 |
| 2009/0223539 | A1* | 9/2009 | Gibbel | H01L 31/18 134/2 |
| 2009/0274361 | A1* | 11/2009 | Schwab | H01L 31/022425 382/145 |
| 2010/0173441 | A1* | 7/2010 | Blakers | H01L 31/042 438/758 |
| 2011/0130002 | A1* | 6/2011 | Bankaitis | H01L 21/30625 438/692 |
| 2011/0297223 | A1* | 12/2011 | Krause | H01L 31/182 117/63 |
| 2012/0132638 | A1 | 5/2012 | Rey Garcia et al. | |
| 2012/0164379 | A1* | 6/2012 | Sherman | C30B 15/10 117/13 |
| 2015/0349145 | A1 | 12/2015 | Morad et al. | |
| 2016/0163914 | A1* | 6/2016 | Gonzalez | H01L 31/049 156/60 |
| 2017/0051429 | A1* | 2/2017 | Sachs | H01L 29/0657 |
| 2017/0092463 | A1* | 3/2017 | Yakub | C30B 29/64 |
| 2017/0229595 | A1* | 8/2017 | Ganguly | H02S 30/10 |
| 2019/0081198 | A1* | 3/2019 | Morad | H01L 31/0508 |
| 2019/0088815 | A1* | 3/2019 | Clevenger | H01L 31/049 |
| 2019/0131475 | A1* | 5/2019 | Sun | H01L 31/022441 |
| 2019/0140124 | A1* | 5/2019 | Sun | H01L 31/03529 |
| 2020/0033308 | A1* | 1/2020 | Kotsugai | H01L 21/67775 |

OTHER PUBLICATIONS

European Office Communication, Supplementary European Search Report for European Patent Application No. 18870017, dated Jun. 29, 2021, 9 pages.

International Search Report of the International Search Authority for International Patent Application No. PCT/US2018/057031, dated Feb. 27, 2019, 4 pages.

Written Opinion of the International Search Authority for International Patent Application No. PCT/US2018/057031, dated Feb. 27, 2019, 5 pages.

* cited by examiner

SEMI-CONDUCTOR WAFERS LONGER THAN INDUSTRY STANDARD SQUARE

CROSS-REFERENCE TO RELATED APPLICATIONS

This claims priority to U.S. Provisional application No. 62/576,143, filed on Oct. 24, 2017, entitled SEMI-CONDUCTOR WAFERS FOR USE IN SOLAR CELLS AND MODULES THAT ARE LONGER THAN SIZE OF A SIDE OF THE INDUSTRY STANDARD SQUARE, AND METHODS OF MAKING AND USING SAME AND SOLAR CELLS AND MODULES INCORPORATING SAME, the full disclosure of which is fully incorporated by reference, herein.

BACKGROUND

Wafers that are used in solar cells and solar modules are generally square. They are manufactured in squares, which are trimmed to a final size, and used in that shape. Alternatively, in some cases, they are manufactured in the square shape, and then are cut into smaller units which are arranged in such a way to expose most if not all of the surface area of the manufactured wafer to the sun, but to also reduce other losses that arise if the full squares are used in their original shapes.

The standards for wafers for the Photovoltaic industry are set by the global Photovoltaic Technical Committee of the Semiconductor Equipment and Materials International (SEMI) association. Wafer dimensions are standardized in standard no. PV022-00-1011, to permit common processing equipment to be used in multiple fabrication lines. An excerpt of the dimensional standard is shown in FIG. 1 and Table 1.

TABLE 1

Dimensions of Square Silicon Wafers for PV Solar Cell Applications

| Symbol in FIG. 1[#1] Dimension Name | A (mm) Wafer Edge Length | | G (mm) Diagonal | | H (mm) Chamfer Length | |
|---|---|---|---|---|---|---|
| Normal Size (mm) | Max | Min | Max | Min | Max | Min |
| 100 | 101 | 99 | 142.8 | 140.0 | 2 | 0.5 |
| 125 | 126 | 124 | 178.2 | 175.4 | 2 | 0.5 |
| 156 | 157 | 155 | 222.0 | 219.2 | 2 | 0.5 |
| 210 | 211 | 209 | 298.4 | 295.6 | 2 | 0.5 |
| Symbol in EN 50513 | A, B | | C | | H | |
| Symbol in SEMI M6 | A, B | | C | | D | |

As shown in FIG. 1 and Table 1, the standard wafer shape is square. Specifically, for the nominally 156 mm wafer, which has become the standard wafer size for the PV industry, the size for the dimension A, which is the size of one side of the square, may be between 155 mm and 157 mm. The range of 2 mm (1 mm+/−) around the nominal 156 mm was originally provided to accommodate inaccuracies and tolerances in manufacturing equipment and processing, as well as in material handling machinery.

As of October 2017, the product in actual use was near the larger end of this specification, namely at 157 mm. This is because wafer sawing and handling operations have become more precise. In addition, because the power that is provided by a photovoltaic module is directly proportional to the surface area of the silicon exposed to solar energy, other things being equal, it is better for a wafer to be relatively larger, than relatively smaller. Thus, this gradual increase in the square side size has become an important way for cell and module makers to increase module power because of the increase in cell area, while not increasing the number of parts handled. Thus, increasing the size, even by this very small amount of 1 mm per side, provides an increase in area from a 156×156 mm wafer of 24,336 mm$^2$ to a 157×157 mm wafer of 24,649 mm$^2$, of 313 mm$^2$, or an increase of 1.3% in area. This increases the value of cell and module processing operations.

Thus, it can be seen that increasing the area of a wafer for use in photovoltaic applications has advantages in power production. Thus, it would be desirable to provide larger wafers, other things being equal.

However, providing larger wafers has not been possible for several reasons. One reason relates to the manner that silicon crystals are grown and fabricated. These processes result in square wafers. The wafers could be made larger or smaller, yet still, as explained below, the processes lead to square wafers. Smaller wafers have been made in the past. Larger wafers could be made, but there are some electrical losses that arise in larger wafers. As such, the industry has settled on the nominal standard 156 mm square wafer as providing the right balance between surface area for exposure to solar energy for power production and electrical losses (which lead to less power production).

Turning to a brief discussion of how such square wafers are formed, there are two types of wafers: monocrystalline and multicrystalline.

Monocrystalline wafers are cut from large cylindrical crystals. Since efficient silicon utilization is an important parameter in the production costs of silicon wafers, cutting square wafers from a round crystal is more economical than cutting rectangular wafers, because there is less waste in cutting the largest possible square from a circle, than cutting the largest possible rectangle from the same sized circle.

Multicrystalline wafers are cut from bricks of silicon, which are cut from larger ingots. These ingots are grown in large furnaces, and because the process conditions need to be as identical as possible over the whole ingot, symmetry of the processing unit is an important factor. Thus, these ingots are also grown either in rounds or squares. Since square ingots allow better silicon utilization than round ones, the design of these furnaces are all centered on square ingots. The standard multicrystalline ingot and resulting bricks are shown in FIG. 2. These bricks with a square cross-section will be sawn into square wafers in a subsequent wire-sawing step.

Thus, for at least these two reasons, the industry standard wafer is a square. As mentioned above in the standard PV022-00-1011, the industry has an interest in standardizing the size of the wafers so that they can be used in the also standard-sized wafer processing equipment.

One advantage of having the wafers be squares, as opposed to rectangles, is that their handling and use is insensitive to their orientation, because the size of both of their sides is equal. Thus, a processor need not keep track of which dimension of the wafer is its width, and which is its length, because they are equivalent, and the processing equipment is insensitive to which dimension is loaded into it along any axis of alignment.

The wafer processing industry has thus made enormous investments in the machinery that handles and processes silicon wafers from their raw, as formed state, to their final position in a finished solar module. Briefly, a bare silicon wafer undergoes the following steps (along with others) in approximately the following order: incoming inspection; wet bench cleaning; texturing; POCl emitter diffusion; silicon nitride deposition; screen printing; firing; measuring/inspection; and stringing.

Many of these steps involve transport on belts, either single file or several wafers wide. An inspection system is shown in FIG. 3, which involves moving the wafers along on belts. Transport along such belts typically are designed to accommodate square wafers of the standardized width, using guide posts, walls 310, or spacing, dependent upon the standard size wafer width.

Some steps, or sub-steps between steps, require that the wafers be placed in carriers, such as show in FIG. 4. Such carriers are sized to accept wafers no wider than a width equal to the standard square wafer size A (156-157 mm) between parallel sets of rails 420a and 420b.

Another processing step is a wet bench processing step, such as shown at FIG. 5, which has transport rollers 530 that are spaced apart a distance that requires the standardized size of the wafer side A (156-157 mm) so that the wafer will fit between the guide collars 530. The processing and handling equipment shown in FIGS. 3, 4 and 5 are representative only and are not exhaustive. But, they generally show the manner in which wafers are handled, for instance in a carrier that contacts wafers on two or three of their four edges, while leaving two or three of the remaining edges free of contact or support, or that supports wafers on their planar surface and moves them along in a direction of travel, while also securing the wafers against slippage on two of their four edges, while leaving at least one and typically two of the remaining two edges free. The carrier type apparatus shown schematically with reference to FIG. 4 may be referred to herein generally as an edge support-handling device. The belt type apparatus shown schematically with reference to FIG. 3, and the roller type apparatus shown schematically with reference to FIG. 5 may be referred to herein generally as planar support handling devices.

Given the advantages that arise due to a larger amount of surface area for each individual wafer, there is a need in the industry to provide larger wafers. That need is seen in how even the small advantage of providing wafers that are 157 mm×157 mm, as compared to those that are 156 mm×156 mm is worth the effort to make the wafers as large as the processing equipment will allow. However, given the geometrical constraints of wafer formation that lead to square wafers, and given that the industry has invested enormous sums of money in the processing equipment that can accommodate these nominally 156 mm×156 mm (but in actuality now 157 mm×157 mm) square wafers, it would be very costly for any one module maker to try to use wafers that are larger than the 157 mm×157 mm upper limit of the standard.

Thus, there is a need to provide a wafer that has more surface area than the 156/157×156/157 mm square wafers. There is also a need to provide such a larger wafer than can be handled, processed and in general used in the standard sized equipment that is in place to process the A=156/157 mm square wafer. There is a further need to provide such a larger, yet useable wafer without wasting silicon in any cutting or processing steps.

BRIEF SUMMARY

The instant application reports that wafers can be made according to a relatively new process, known as the Direct Wafer (DW) making process, described in the below referenced DW patents, and that such wafers can be made that have the industry standard size A (presently 156 mm+/−1 mm) as the dimension of one side, referred to herein as its width, and a longer perpendicular dimension, referred to herein as its length. This added length, compared to a square wafer of dimensions A×A, provides a very large amount of additional surface area. The wafers with industry-standard width and greater than industry-standard length disclosed herein can be processed in the vast majority of currently used wafer processing and handling equipment, either without any modification to the equipment, or, with modifications that are relatively simple, conceptually, and modest in cost, as compared to the cost savings that arise from the additional surface area of use. A further advantage of wafer and module manufacturing cost and economies is that the cost of handling a slightly larger wafer is almost zero. The cost of the additional silicon is very small, and, in any case, that silicon would have been part of the cost of a different wafer. Thus, it is not actually an additional cost of the entire solar collecting apparatus. Thus, the economies of handling the much larger amount of surface area for the same number of pieces of (slightly larger) silicon wafers are such that it is well worth the effort.

Thus, in some embodiments an invention hereof is a rectangular wafer that is as wide as the square wafer width industry standard width A (presently 156 mm+/−1 mm), and that is longer than the industry standard square wafer A by at least 1 additional millimeter and as much as the standard equipment can reasonably be made to accommodate. A preferred additional length is at least 3 mm, and it is believed that an additional 20 mm is also manageable without unduly difficult changes being made to the processing equipment presently in use.

In some embodiments, a semiconductor article hereof is a rectangular semiconductor wafer having a first edge having a width size w equal to industry standard square wafer size A, and a second edge having a length size L that is larger than the size of the first edge, such that L equals A+x, where x is at least three mm. The industry standard size square wafer size A is equal to 156±1 mm. The length size L of the second edge equals A+x, where x can be between three mm and twenty-five mm.

In some embodiments x can be between 3 mm and 20 mm, 4 mm and 20 mm, 5 mm and 20 mm, 8 mm and 20 mm, or 10 mm and 20 mm. In some embodiments x can be 3 mm, 4 mm, 5 mm, 6 mm, 7 mm, 8 mm, 9 mm, 10 mm, 11 mm, 12 mm, 13 mm, 14 mm, 15 mm, 16 mm, 17 mm, 18 mm, 19 mm, 20 mm, 21 mm, 22 mm, 23 mm, 24 mm, or 25 mm.

In some embodiments, the semiconductor wafer can further have electrically conductive gridlines and additional carriers. In other embodiments, there may further be a plurality of additional substantially similar wafers with conductive gridlines and additional carriers, arranged in a grid and interconnected with electrical conductors, to form a module. The grid can have the plurality of wafers arranged in a plurality of rows, each row comprising a plurality of wafers arranged side by side, with their width edges arranged co-linearly and their length edges arranged parallel to each other. The grid may further have the plurality of wafers arranged in a plurality of rows, each row arranged adjacent another row, with the width edges of the wafers of a row arranged parallel to each other, and the length edges arranged co-linearly with the respective length edges of respective wafers of an adjacent row.

In some embodiments, a semiconductor article hereof can be a rectangular semiconductor wafer having a first edge having a width size w equal to industry standard size A, and a second edge having a length size F, that is less than square wafer size A. The length size F is a fraction 1/n, where n is an integer, of a size L that is larger than the size of the first edge, such that L equals A+x, and F equals L/n, which equals (A+x)/n, where x is at least three mm. For such a fractionally sized semiconductor article, n may be any integer, such as for instance 2, 3, 4, 5 and 6. x can be between three mm and twenty-five mm. Similarly to above, in some embodiments the fractionally sized semiconductor article may further comprise electrically conductive gridlines and additional carriers. A plurality of additional substantially similar wafers with conductive gridlines and additional carriers, can be arranged in a grid and interconnected with electrical conductors, to form a module of such semiconductor articles. The grid may exhibit the plurality of wafers arranged in a plurality of rows, each row comprising a plurality of wafers arranged side by side, with their width edges arranged co-linearly and their length edges arranged parallel to each other. The grid may have the plurality of wafers arranged in a plurality of rows, each row arranged adjacent another row, with the width edges of the wafers of a row arranged parallel to each other, and the length edges arranged co-linearly with the respective length edges of respective wafers of an adjacent row.

In some embodiments, a method hereof is a method of handling a semiconductor wafer. The method comprises: providing a rectangular semiconductor wafer having a first edge having a width size w equal to industry standard size square wafer size A, and a second edge having a length size L that is larger than the size of the first edge, such that L equals A+x, where x is at least three mm. The method also entails providing a semiconductor wafer processing apparatus sized to handle and process industry standard square wafer size A wafers, the processing apparatus having a wafer retaining portion sized to retain a wafer having a first edge having a width size w equal to industry standard size square wafer A and having a configuration that also accommodates such a wafer with a second edge having a length size L greater than A. The method also includes providing such a wafer to the wafer processing apparatus retaining portion such that the first edge having width size w is retained in the retaining portion, and such that the second edge having length size L greater than A is also accommodated, and thus handled. The wafer processing apparatus may have an edge support apparatus. In one embodiment, the wafer processing apparatus may be an inspection station having a movable belt, arranged to move in a travel direction, the step of providing the wafer to the wafer processing apparatus entailing placing the wafer on the belt such that the edge having length size L greater than A is arranged parallel to the travel direction. The inspection station may have guide walls, in which case the step of providing the wafer to the wafer processing apparatus further entails placing the wafer on the belt such that the edge having length size w is arranged perpendicular to the travel direction and the wafer fits between the guide walls.

According to a related method embodiment of an invention hereof, the wafer processing apparatus can be a wet processing station employing a wet process carrier having wafer retaining portion with a bottom support and a pair of edge supports, each of which has a lower portion, adjacent the bottom support, and an upper portion, spaced away from the bottom support, with the upper portion spaced away from the bottom support in a first direction, and the pair of edge supports spaced away from each other in a second direction, perpendicular to the first direction a distance sized to securely retain a standard wafer of size square wafer of size A, between the pair of supports. There can also be open space in a volume bounded by the support and the pair of edge supports, the open space extending away from the support in the first direction a distance at least as large as L. The step of providing the wafer to the wafer processing apparatus can be placing the wafer in the carrier such that the edge having length size L is arranged parallel to the first direction and such that the edge having a width size w is arranged to fit between the pair of edge supports. The pair of edge supports can be a pair of rails or a pair of walls, or any other suitable mechanical holding configuration.

With yet other related method embodiments of inventions hereof, the wafer processing apparatus may be a wet bench transport station comprising a movable belt, arranged to move in a travel direction, the step of providing the wafer to the wafer processing apparatus comprising placing the wafer on the belt such that the edge having length size L is arranged parallel to the travel direction. The wet bench transport station may also include guide collars, where the step of providing the wafer to the wafer processing apparatus further entails placing the wafer on the belt, such that the edge having length size w is arranged perpendicular to the travel direction and so that the wafer fits between the guide collars. Rather than using a belt upon which to transport a wafer, a wet bench transport station may use rollers.

In one aspect, a method of handling a semiconductor wafer comprises: (a) providing a rectangular semiconductor wafer having a first edge having a width size w equal to industry standard size A, and a second edge having a length size L that is larger than the size of the first edge, such that L equals A+x, where x is at least three mm; (b) providing a semiconductor wafer processing apparatus sized to handle and process industry standard size A wafers, the processing apparatus having a wafer retaining portion sized to retain a wafer having a first edge having a width size w equal to industry standard size A and having a configuration that also accommodates said wafer with a second edge having a length size L; (c) providing the wafer to the wafer processing apparatus retaining portion such that the first edge having width size w is retained in the retaining portion, and such that the second edge having length size L is also accommodated, and thus handled.

In some embodiments, the wafer processing apparatus comprises an edge support apparatus.

In some embodiments, the wafer processing apparatus comprises a planar support apparatus.

In some embodiments, the wafer processing apparatus comprises an inspection station comprising a movable belt, arranged to move in a travel direction, and the step of providing the wafer to the wafer processing apparatus comprises placing the wafer on the belt such that the edge having length size L is arranged parallel to the travel direction.

In some embodiments, the inspection station comprises guide walls, and the step of providing the wafer to the wafer processing apparatus further comprises placing the wafer on the belt such that the edge having length size w is arranged perpendicular to the travel direction and so that the wafer fits between the guide walls.

In some embodiments, the wafer processing apparatus comprises a wet processing station comprising a wet process carrier comprising wafer retaining portion comprising a bottom support and a pair of edge supports, each of which has a lower portion, adjacent the bottom support, and an upper portion, spaced away from the bottom support, with the upper portion spaced away from the bottom support in a first direction, and the pair of edge supports spaced away from each other in a second direction, perpendicular to the first direction a distance sized to securely retain a standard wafer of size A, between the pair of supports, there also being open space in a volume bounded by the support and the pair of edge supports, and the open space extending away from the support in the first direction a distance at least as large as L, and the step of providing the wafer to the wafer processing apparatus comprises placing the wafer in the carrier such that the edge having length size L is arranged parallel to the first direction and such that the edge having a width size w is arranged to fit between the pair of edge supports.

In some embodiments, the pair of edge supports comprises a pair of rails.

In some embodiments, wherein the pair of edge supports comprises a pair of walls.

In some embodiments, the wafer processing apparatus comprises a wet bench transport station comprising a movable belt, arranged to move in a travel direction, and the step of providing the wafer to the wafer processing apparatus comprises placing the wafer on the belt such that the edge having length size L is arranged parallel to the travel direction.

In some embodiments, the wafer processing apparatus comprises a wet bench transport station comprising rollers, arranged to move in a travel direction, and the step of providing the wafer to the wafer processing apparatus comprises placing the wafer on the rollers such that the edge having length size L is arranged parallel to the travel direction.

In some embodiments, the wet bench transport station comprises guide collars, and the step of providing the wafer to the wafer processing apparatus further comprises placing the wafer on the belt, such that the edge having length size w is arranged perpendicular to the travel direction and so that the wafer fits between the guide collars.

In some embodiments, the wet bench transport station comprises guide collars, and the step of providing the wafer to the wafer processing apparatus further comprises placing the wafer on the rollers, such that the edge having length size w is arranged perpendicular to the travel direction and so that the wafer fits between the guide collars In another aspect, a semiconductor article comprises a rectangular semiconductor wafer having a first edge having a width size w equal to industry standard size A, and a second edge having a length size L that is larger than the size of the first edge, such that L equals A+x, where x is at least three mm.

In some embodiments, industry standard size A is equal to 156 mm plus or minus one mm.

In some embodiments, x is between three mm and twenty-five mm.

In some embodiments, the semiconductor wafer further comprises electrically conductive gridlines and carriers.

In some embodiments, the semiconductor wafer further comprises a plurality of additional substantially similar wafers, arranged in a grid and interconnected with electrical conductors, to form a module.

In some embodiments, the grid is arranged in a plurality of rows, each row comprising a plurality of wafers arranged side by side, with width edges of the wafers arranged co-linearly and their length edges arranged parallel to each other.

In some embodiments, each row is arranged adjacent another row, with the width edges of the wafers of a row arranged parallel to each other, and the length edges arranged co-linearly with the respective length edges of respective wafers of an adjacent row.

In another aspect, a semiconductor article comprises a rectangular semiconductor wafer having a first edge having a width size w equal to industry standard size A, and a second edge having a length size F, that is a fraction 1/n, where n is an integer, of a size L that is larger than the size of the first edge, such that L equals A+x, and F equals L/n, which equals (A+x)/n, where x is at least three mm.

In some embodiments, n is chosen from the group consisting of 2, 3, 4, 5 and 6.

In some embodiments, x is between three mm and twenty-five mm.

In some embodiments, the semiconductor wafer further comprises electrically conductive gridlines and carriers.

In some embodiments, the semiconductor wafer further comprises a plurality of additional substantially similar wafers, arranged in a grid and interconnected with electrical conductors, to form a module.

In some embodiments, each row comprising a plurality of wafers is arranged side by side, with width edges of the wafers arranged co-linearly and their length edges arranged parallel to each other.

In some embodiments, each row is arranged adjacent another row, with the width edges of the wafers of a row arranged parallel to each other, and the length edges arranged co-linearly with the respective length edges of respective wafers of an adjacent row.

These and other objects and aspects of inventions disclosed herein will be better understood with reference to the Figures of the Drawing, of which:

DETAILED DESCRIPTION

Figure 1:
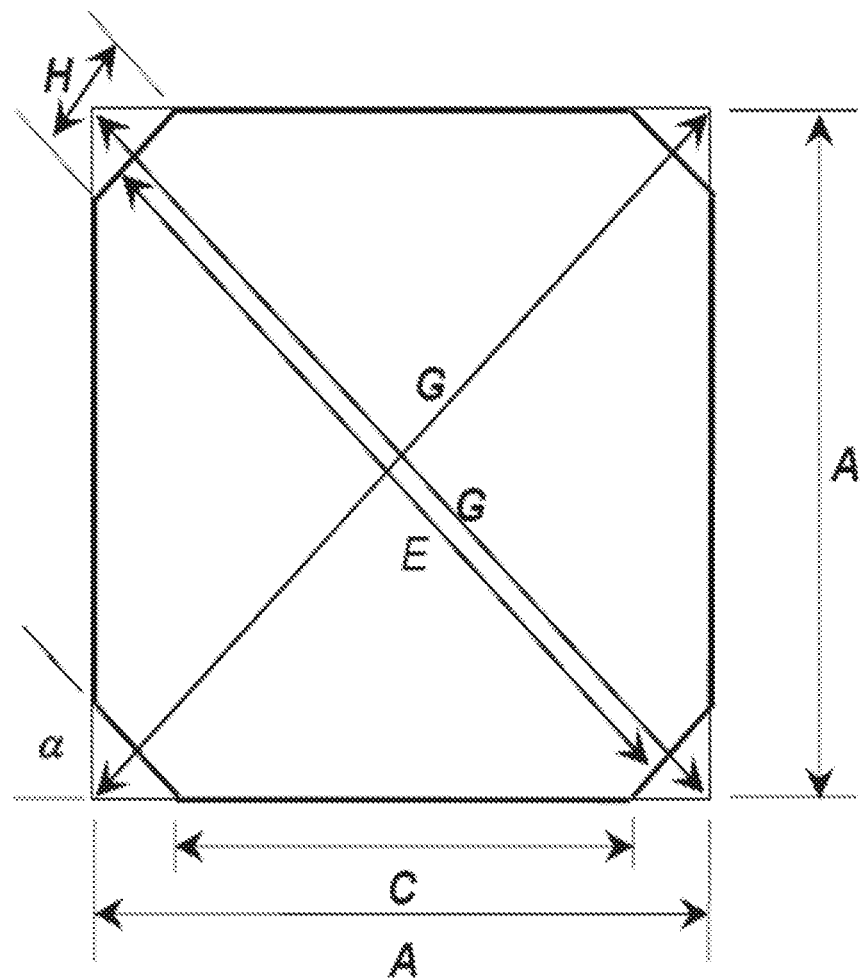
FIG. 1 is a schematic representation of a square wafer sized according to the SEMI standard PV22-00-1011, the dimensions being defined in Table 1.
Figure 2:
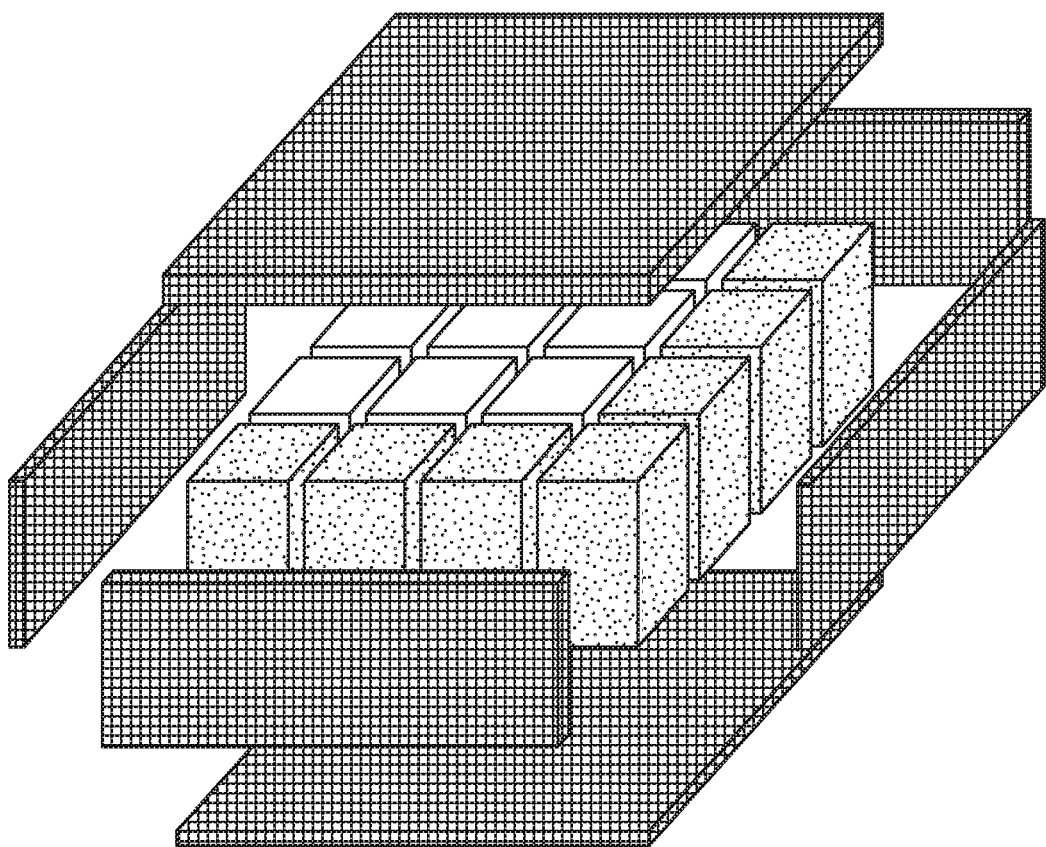
FIG. 2 (Prior Art) is a schematic representation showing a multicrystalline silicon ingot and the sawing pattern to create bricks that will yield square wafers.

Certain processing schemes and architecture are disclosed in U.S. Pat. No. 8,293,009B2, titled Methods For Efficiently Making Thin Semiconductor Bodies From Molten Material For Solar Cells and the Like, inventors Emanuel M. Sachs et al., assigned to 1366 Technologies Inc., which issued on Oct. 23, 2012, and additional patents related thereto, including U.S. Pat. No. 8,696,810, issued on Apr. 15, 2014 and U.S. Pat. No. 9,643,342, issued on May 9, 2017. The above-mentioned patent disclosures are hereby incorporated fully herein by reference. The technology disclosed in the above referenced patents is referred to herein collectively as Direct Wafer (DW) technology.

Aspects of the invention disclosed herein relate to wafers that are of an industry standard size along one dimension, referred to herein as their width w, and which are longer along the dimension that is perpendicular to the standard size width, referred to herein as the wafer's length nL. The industry standard refers to the standard dimension as A used for square wafers, and it assigns a standard size, which is expressed in Table 1 above, which size is nominally 156 mm, with plus or minus 1 mm, for a maximum of 157 mm. It will thus be understood that according to the specification, square wafers can have an edge, or side size w, which must fit the standard A, which can range between 155 and 157 mm.

As has been discussed above, the industry standard is square wafers. This was historically due to the means by which wafers were always fabricated, discussed above, for which the square size was most efficient, or, in some cases, the only shape that was practically possible. As a result of this manufacturing limitation, all wafers are square, with some having different widths. Over time, the industry settled on the size of 156 mm as being the nominal size. At earlier times in history, the square standard size had edges that were shorter than 156 mm.

A different way of making silicon wafers directly from a melt of molten silicon has been developed, as described in the Direct Wafer technology (DW) patents identified above. Because the industry standard is for square wafers, and because it is beneficial for wafers to fit within and be easily handled by industry standard machinery, the DW process produces square wafers. However, square-ness of the manufactured wafer (or any symmetry) is not a limitation of the DW process. The DW process is able to make wafers of many different shapes, and the shapes need not be symmetrical or square or round.

Briefly, according to the Direct Wafer (DW) wafer forming technology, a pressure differential is applied across a porous mold sheet and a semiconductor (e.g. silicon) wafer is formed thereon. Relaxation of the pressure differential allows release of the wafer. The mold sheet may be cooler than the melt. Heat is extracted through the thickness of the forming wafer. The liquid and solid interface is substantially parallel to the mold sheet. The temperature of the solidifying body is substantially uniform across its width, resulting in low stresses and dislocation density and higher crystallographic quality. The porous mold sheet must be sufficiently permeable to allow flow of gas through it. It must not be so permeable as to allow the intrusion of molten material into the openings of the porosities during the time the pressure differential is provided. Otherwise, the porosities would become clogged and the pressure differential could not be maintained. The melt can be introduced to the sheet by: full area contact with the top of a melt; traversing a partial area contact of melt with the mold sheet, whether horizontal or vertical, or in between; and by dipping the mold into a melt. The grain size can be controlled by many means. The pressure differential, sometimes referred to in the Direct Wafer technology patent, U.S. Pat. No. 8,293,009B2, and herein as the differential pressure regime, may be established, by maintaining the melt surface at atmospheric pressure, and maintaining the back surface of the mold sheet at less than atmospheric pressure. In another embodiment differential pressure between the faces of the mold sheet is generated by venting the back face of the mold sheet directly to atmosphere, while maintaining the atmosphere on the forming face of the mold sheet at a pressure substantially higher than local atmospheric pressure. An advantage of this embodiment is that a vacuum pump is not required. The mold face and the melt surface contact each other for a period of time that may be referred to as a contact duration. During at least a part of the contact duration, the differential pressure regime is provided. It is beneficial to form the wafer from the melt, and to create a solidified body within the melt, and to form such a body, for instance a wafer, on the mold sheet (or a template). It need not be released from the mold sheet (or template) to constitute a valuable article of manufacture. But also, the formed wafer can be removed from the mold sheet in a variety of ways. In some cases, the differential pressure regime can be removed, i.e., if a vacuum is used, it can be turned off, and the wafer falls off. Or, the differential pressure regime can be reduced—i.e., the degree of vacuum can be reduced, or, the difference in pressure can be reduced. Further, mechanical means, such as stripping pins, a stripping frame, or other tools that mechanically contact the wafer and press it away from the mold-sheet in order to reduce the differential pressure, can be used.

Regarding the porosity of the mold sheet, in one embodiment, the porosity of the surface touching the at first molten and later solidified semiconductor material, must be small enough in scale so as to make it difficult for the molten semiconductor to enter into the porosities. Typically, the pore size of interest may range from 0.1 to 10.0 microns and any interval of 0.1 micron in between. The porosities are interconnected so that gas passing through the porous medium of the mold typically flows in complex patterns, thus accommodating local blockages by finding circuitous paths around any blockages.

The very outer surface of the porous body, which forms the surface that faces and contacts the surface of the molten material, may be slightly non-planar (on a microscopic or slightly larger scale), thus allowing the molten semiconductor to touch the mold surface only at particular, although numerous and densely packed locations. With this structure, gas can flow a bit laterally between the molten material and the surface of the porous mold. This permits the suction that is provided by the differential pressure regime to apply force upon the wafer surface over a very large percentage of its surface area, approximately 100%. This is in contrast to a case where a smaller number of larger holes could be provided, through which holes the differential pressure could be provided, to establish an equivalent pressure differential. In the latter case, the locus of the pressure differential is confined to the relatively small surface area of the relatively small number of large holes. In contrast, in the former case, of a truly porous body, because the gas can flow laterally, the pressure differential is actually present in a much more distributed nature over the entire surface area of the mold and attached wafer. The word porous is used herein to describe the former case, and not the latter.

Wafers made by a Direct Wafer (DW) wafer forming technology method have certain advantages over wire-sawn wafers, for instance there is much less waste of raw silicon, because there is no material ground to powder and thus lost to sawing. Furthermore, the method by which they are made, principally by contacting a mold to a surface of molten material, lends itself to specific control of certain aspects of wafer fabrication, as discussed below.

Importantly, wafers made according to the DW fabricating process need not be square. They can be nearly any shape. What is required is to provide a mold surface having the shape (meaning, the perimeter shape) of the desired wafer. If a square mold sheet is used, square wafers will be produced. If a rectangular mold sheet, having one edge size w equal to A, the industry standard, and the other edge size equal to w+x, where x is greater than 1 mm, then the wafer that is produced will have a rectangular shape of dimensions w by (w+x). If a circular mold sheet is used, then the produced wafer will be circular. The same can be said for mold sheets that are oval, triangular, or any shape, regular or irregular, which will produce wafers having a perimeter shape that is congruent in shape and equivalent in size to the mold sheet perimeter.

Rather than using a mold sheet that precisely, or even approximately matches the shape of the final form of a wafer, it is also possible to use a mold sheet that forms a wafer that is larger than the final desired shape and size, and then to cut out the desired shape, and to re-melt and reuse the trimmed away pieces that are not used. In that manner, there is no waste of the molten silicon.

Although it may be thought that larger wafers provide more opportunity for collecting solar energy, and thus, for producing more power, the industry is locked into the limitation that there is an industry standard for square wafers having equal edges A, of size defined by the standard. That is what the machinery accepts, and thus, that is what size the wafers must be. As the industry techniques have been refined, as explained above, and the whole industry has trended toward producing wafers at the upper limit of the standard for A (157 mm).

In some embodiments, wafers that have one edge size (designated herein a width) that fulfills the industry standard A for w=157 mm, but which have a perpendicular dimension (designated herein a length) that is longer than A(w+x). These wafers not only can be made using the DW technology efficiently and economically and at virtually no extra cost over a square wafer that satisfies the standard size A, but such longer wafers can also be handled and manipulated and used in the vast majority of industry standard equipment with no, or only minor modifications, as explained below. Although the industry equipment is indeed sized and configured to accept square wafers of size A on both edges, most items of equipment are constrained by size only along one of the two perpendicular dimensions of the wafer's orientation. Thus, surprisingly, they can accommodate longer wafers along one dimension, as explained in more detail below.

Before turning to a discussion of how longer wafers can be used in such standard equipment, a description of such longer wafers will first be provided.

Figure 6:
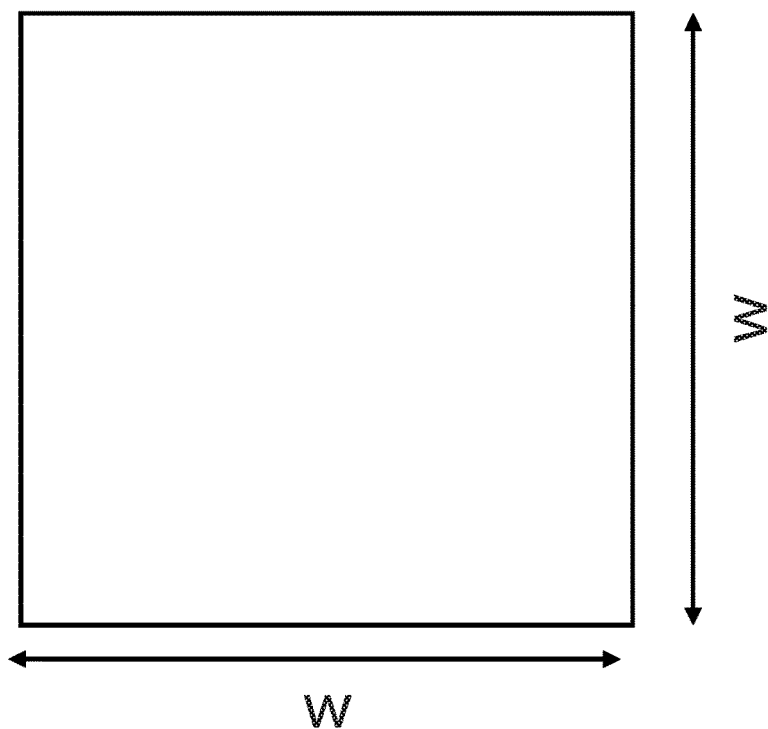
FIG. 6 (Prior Art) shows schematically, an industry standard square wafer having equal side standard size A=w.
Figure 7:
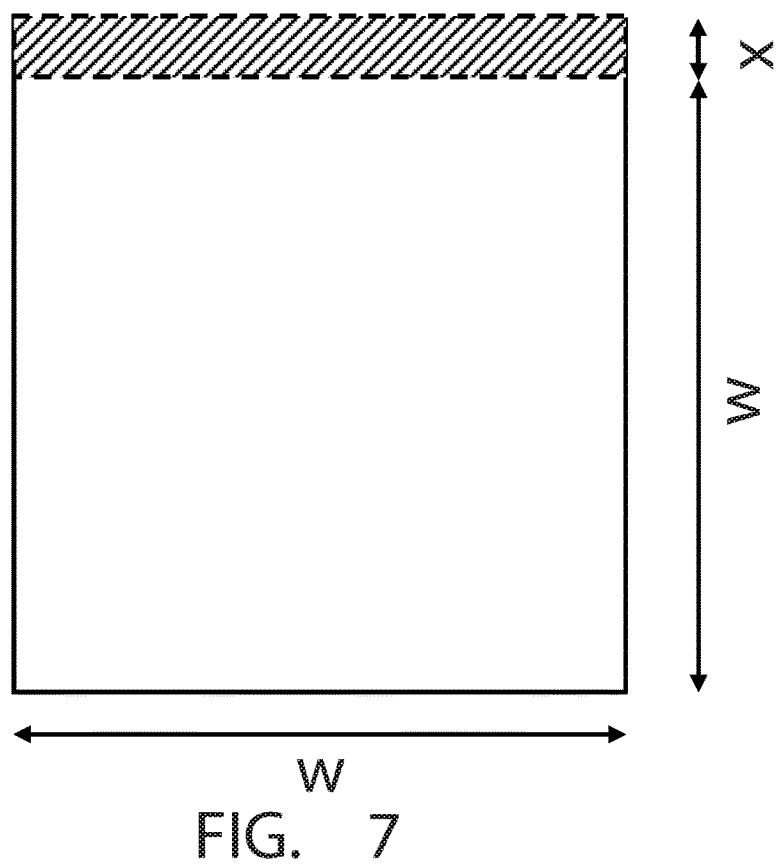
FIG. 7 shows schematically a wafer of an aspect of the invention hereof having a width w equal to the industry standard size A, and a length equal to w (A) plus an added length x.

FIG. 7 shows a wafer of an aspect of the invention hereof that has two perpendicular dimensions. The first, width dimension has a size of the industry standard length A, designated as w. The perpendicular dimension to the width, the length, is larger than w, by an additional amount x, for a total length of w+x. For comparison sake, a square industry standard wafer is shown in FIG. 6, which has two sides of equal length, both the industry standard size A, which at present is as set forth in Table 1, nominally 156 mm+/−1 mm.

Figure 8:
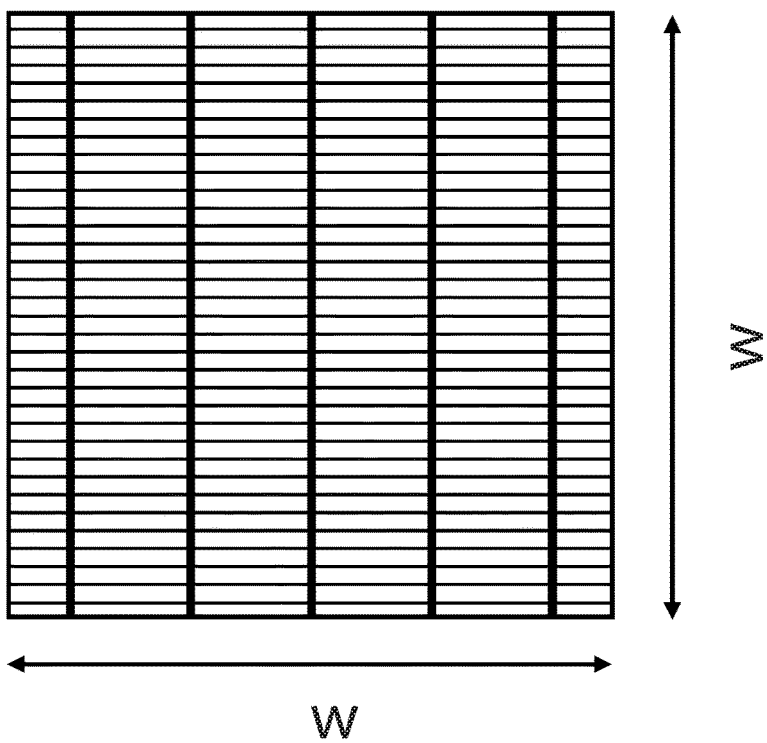
FIG. 8 (Prior Art) shows, schematically, the square industry standard size A=w by w wafer with current carrying gridlines.
Figure 9:
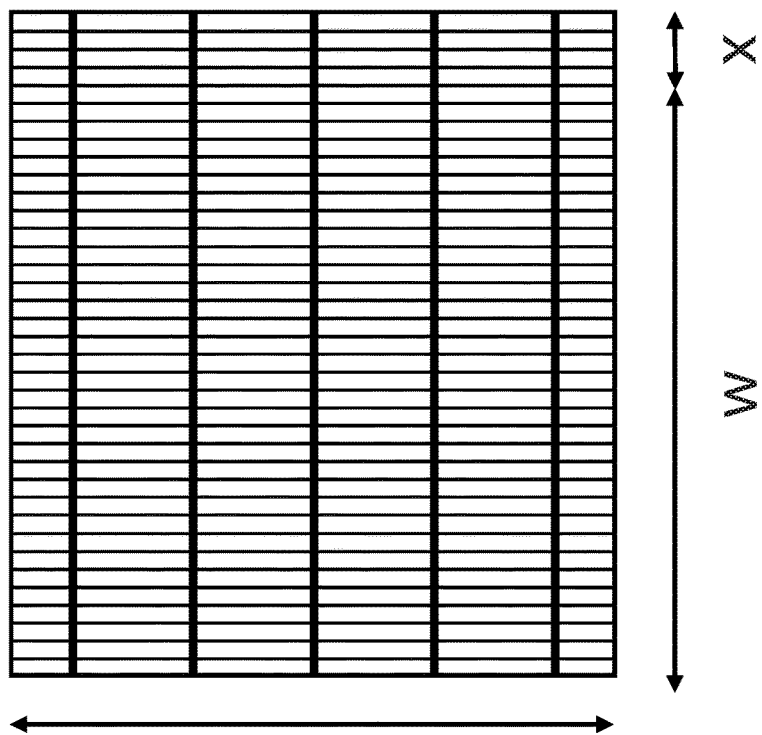
FIG. 9 shows, schematically a wafer of an embodiment of the invention hereof of rectangular shape width w and length w+x, with current carrying gridlines provided.

FIG. 9 shows a wafer of FIG. 7 of an embodiment of the invention hereof, which has been further processed to carry conductive gridlines and perpendicular additional carriers, for carrying electrical current and charge from where it is generated within the body of the wafer, to the edges or other locations where more electrical conductors are provided to carry the generated electricity away from the wafer and to the place where it will be used, stored, or transported further away. As can be seen, this wafer with electrical conductors has the same dimensions of a width of w and a length of w+x. For comparison sake, an industry standard square wafer is shown in FIG. 8, which also has been provided with electrically conducting gridlines and busbars. The square wafer has two sides of equal size, both the industry standard size A, which at present is as set forth in Table 1, nominally 156 mm+/−1 mm. The number and width of the gridlines and bus bars (perpendicular conducting lines) are shown for example only and are not limiting or to scale.

A module of an embodiment of the invention hereof, may be made up of wafers of aspects of the invention hereof, arranged in a grid, and interconnected with stringers or other such electrical conductors as are known in the industry. Such a module has a number n of rows of wafers, arranged along the dimension of extended length. This module is generally a little larger than a module having an equal number of square industry standard wafers. The difference in length will depend somewhat on the spacing between wafers.

Figure 3:
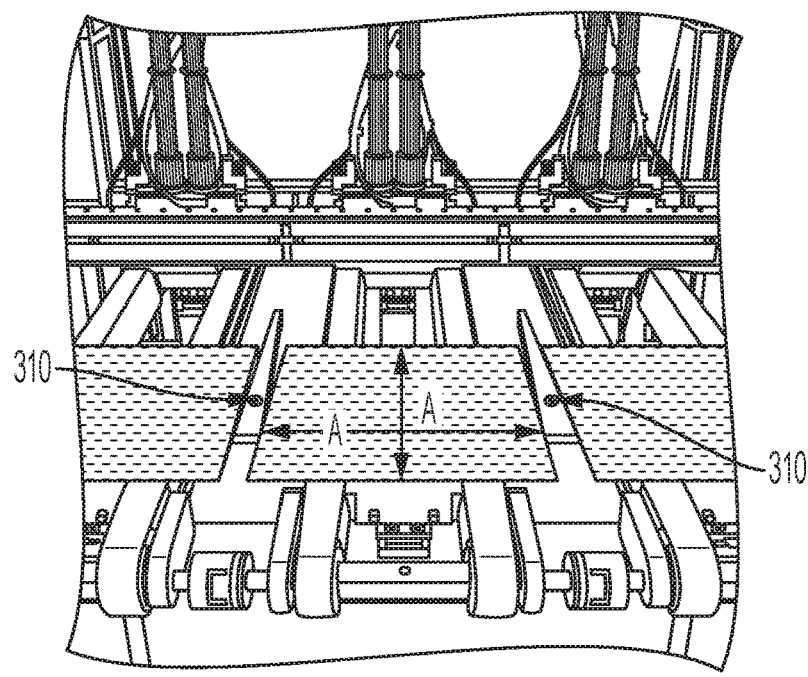
FIG. 3 (Prior Art) shows schematically, a wafer incoming inspection stage, showing a square wafer of industry standard square dimensions A by A traveling on belt.
Figure 14:
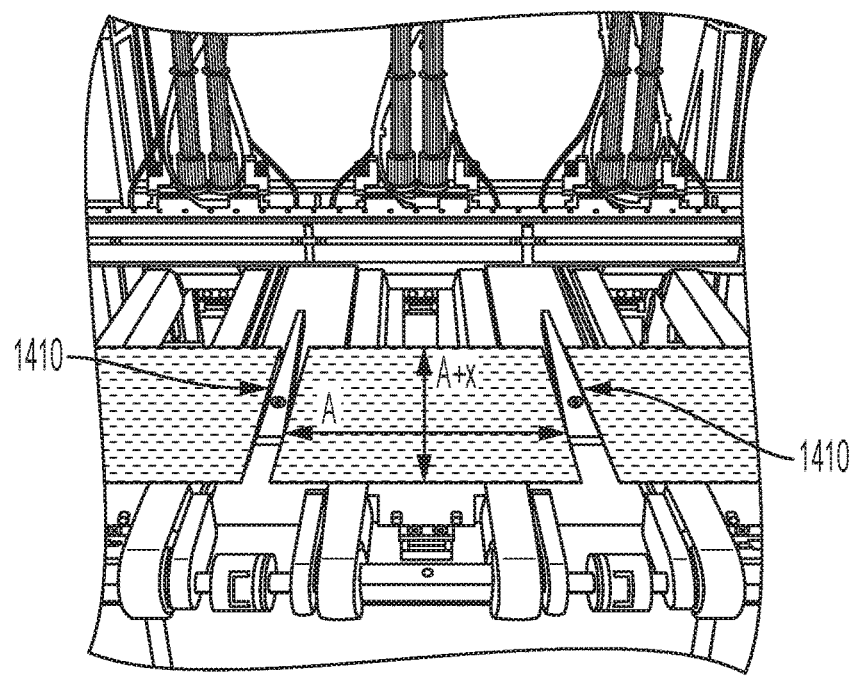
FIG. 14 shows schematically, a wafer incoming inspection stage, showing a wafer of an aspect of the invention hereof traveling on belt, showing how a belt system for a square wafer can accommodate a longer wafer of an aspect hereof of size A+x in length.

Turning now to a discussion of how the rectangular, non-square, larger surface area wafers can be used in and handled by conventional wafer processing equipment designed for use with square wafers, FIG. 14 is illustrative. FIG. 14 shows an incoming planar support inspection station showing a wafer of an embodiment of the invention hereof of dimension A wide by A+x long, supported by and travelling on a belt. In normal operation with a square wafer of size A, as shown in FIG. 3, the wafer extends laterally so that it is wider than the width of the carrying belt. The wafer cannot be so wide in this width direction that it interferes with the guide walls 310, which prevent interference with adjacent wafers on adjacent belts.

However, as shown in FIG. 14, in the perpendicular dimension, parallel to the direction of travel, and parallel to the extended dimension of the belts, there are no restrictions on how long a wafer must be. Thus, a wafer can be longer than A in this direction and the inspection station belt and conveyors may nonetheless transport the longer, rectangular wafer. What is required is that the wafer fit width-wise between the guide walls 1410 and that additional length x not interfere with any surrounding mechanisms. It turns out, surprisingly, this can be achieved in most manufacturing systems with minimal mechanical rearrangement of the apparatus, and thus, the longer, rectangular wafers can be handled by standard sized processing equipment designed for square wafers.

Figure 4:
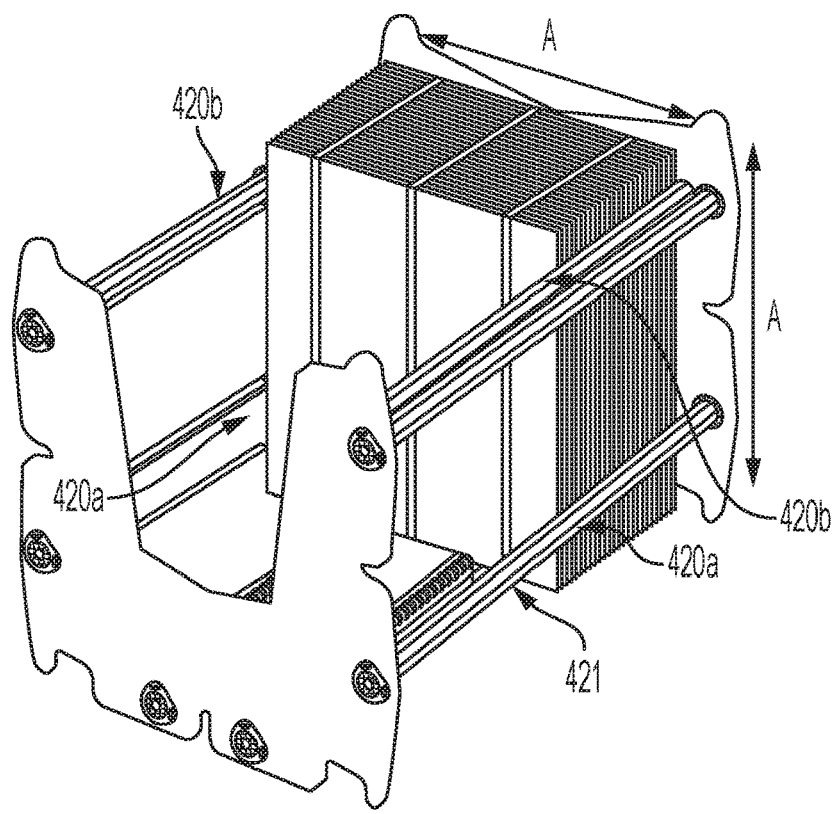
FIG. 4 (Prior Art) shows schematically a wet process carrier for square wafers of industry standard dimensions A by A.
Figure 15:
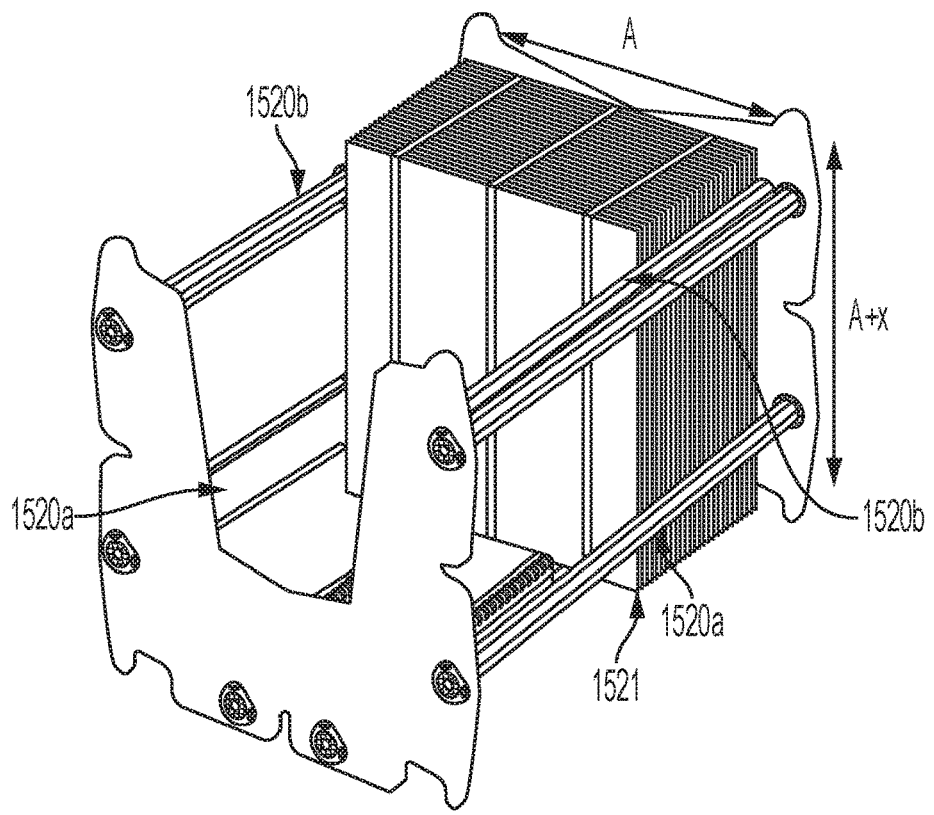
FIG. 15 shows schematically a wet process carrier for industry standard square wafer carrying a longer wafer of an aspect of the invention hereof of size A+x in length.

FIG. 15 shows an edge supporting wet process carrier for square wafers, but which has been loaded with wafers of aspects of the invention hereof that have a width side size A=w, and a longer length side (oriented vertically in the figure) sized A+x,=w+x. The typical carrier shown in FIG. 4 has edge supports, such as rails 420a, 420b, or other versions have walls that are spaced apart in the width dimension a standard distance A (plus a slight space of tolerance to permit insertion of the wafers). The wafers are supported by a bottom support 421, which may be a solid plate, or open mesh, or rails or other suitable design. The edge support has a lower portion 420a, which is relatively near to the bottom support 421, and an upper portion 420b, which is spaced away from the lower portion a sufficient distance to support and stabilize an edge of an industry standard square edge square size A wafer. Rather than two separate elements such as rails 420a and 420b, the edge support could be a wall that extends a sufficient distance to support an edge of a wafer, or one bar, or one wall portion, or more than two rails or bars or wall portions, or a net or web or lattice. The perpendicular, vertical spacing between two rails is typically less than A (w), as can be seen with reference to FIG. 4, in which the square wafers of side size A extend above and below the rails 420b and 420a, respectively in the vertical dimension but are snuggly between rails 420a, 420a and 420b and 420b, in the horizontal dimension.

Typically, there is no top on these edge support carriers. Thus, there is no specific limit on the length size of the wafers perpendicular to the width A distance between the rails. As shown in FIG. 15, a carrier having rails 1520a and 1520b can be the same as the carrier shown in FIG. 4 with the same spacing of rails 420a and 420b, but the carrier in FIG. 15 with the rails 1520a and 1520b, can accommodate a longer as shown wafer. One reason for this is that the top is conveniently left open so that the wafers can be loaded into the carrier from the top, while being supported at its other edges. Further, the upper support rails are sufficient to support longer wafers of length A+X. There are numerous wet processes that use edge support carriers that are built upon similar principles. The wafer edge rests upon a base support 1521 that is similar to the base 421.

Figure 16:
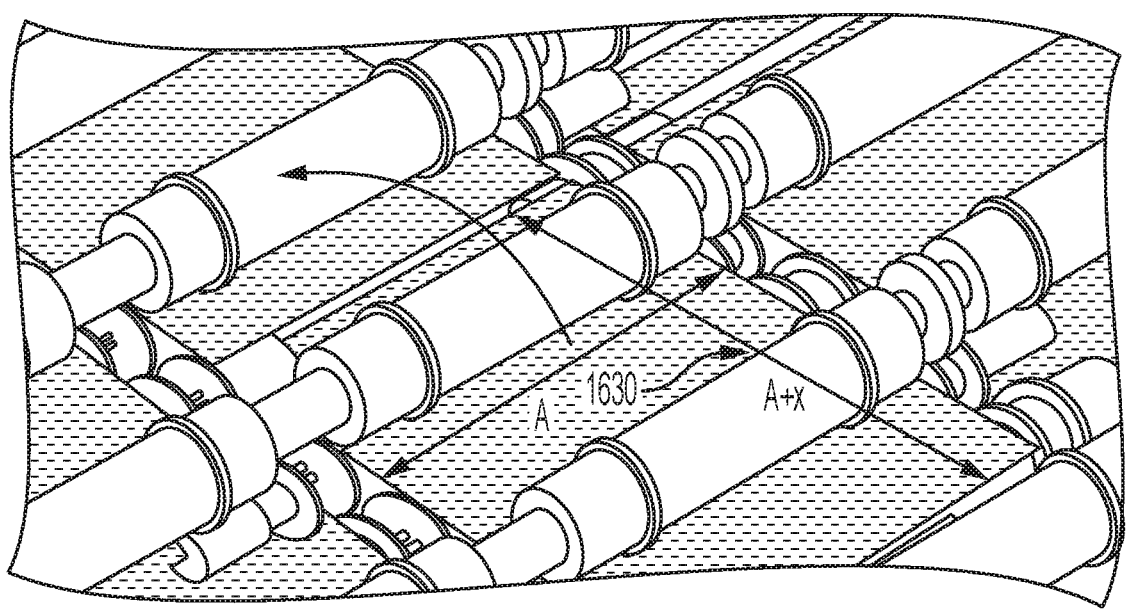
FIG. 16 shows, schematically, rollers in a wet bench, with which square wafers of the industry standard size A in width are required to fit within the guide collars, but which are transporting a longer wafer of an aspect invention hereof, of size A+x in length.

FIG. 16 shows a set of typical planar support wet bench transport rollers. There are guide collars 1630, which are spaced apart a distance A=w, and thus, it is necessary for a wafer that is handled by such transport rollers to have a width size of A=w and no larger along one dimension. But, in the direction of wafer travel, which is perpendicular to this dimension that is sized A, there is no similar limit or hardware, or reason that the length of the wafer must be A=w, or less. Generally, with processes that support a wafer by its planar surface and transport a wafer flat, as shown in FIGS. 14 and 16, it is typically possible for the wafers to be longer than the standard size A=w, in the direction along which the wafers travel.

Wafers of aspects of the invention hereof also lend themselves to use in and handling in connection with another industry trend. That trend relates to cutting wafers into fractional sizes, such as half, or smaller fractions (⅓, ¼, ⅕, ⅙, etc.) along one dimension, while leaving them width A=w in the other dimension. This is done before stringing the wafers together into a module. This is done to reduce the current in the module, and thereby to reduce electrical losses. This trend in the PV industry, as predicted in the International Technology Roadmap for Photovoltaic (ITRPV) report, $8^{th}$ Edition 2017, is that the market adoption of half-cells will continue to grow, and quarter cells will even become available commercially. Half-cells are made as full cells through cell processing, and just before module making, the cells are cut in half with a laser. This reduces interconnections losses, and results in improved module power by almost a full power class (+5 W). Similarly, quarter cut cells are expected to result in more improvement. One module producer, SunPower of San Jose Calif., USA, provides a so-called shingle cell under the P-series product designation, in which fractionally cut wafers of ⅙ fraction, are cut and then connected with electrical conductors, but then are arranged slightly overlapping each other in a shingle style to enable back-to-front electrical contact which reduces losses while achieving maximal exposure to sunlight and minimal wasted space in the module that is not taken up by silicon.

In one embodiment of the invention, wafers hereof are w by w+x mm. Cells cut from these wafers are w by (w+x)/n mm, where x is the increase in length of the wafer relative to its width, w. n is defined as the number of cut cells made by cutting the cell along its length just before stringing. If n=1, then no cuts are made and the cell length matches the original wafer length, w+x. If n=2, the cell is half cut. If n=3, the cell is cut in thirds. If n=4, the cell is quarter cut. If n=5, the cell is cut in fifths. If n=6, such as in the SunPower Series P module, the cell is cut into sixths. The dimensions of these cut cells are once again w by (w+x)/n. Examples of cell dimensions are shown in Table 2.

TABLE 2

Examples of Cell Dimensions.

| Cell cuts | W (mm) | X (mm) | L (mm) |
| --- | --- | --- | --- |
| No cut (n = 1) | 157 | 2 | 159 |
| No cut (n = 1) | 157 | 5 | 162 |
| No cut (n = 1) | 157 | 10 | 167 |
| No cut (n = 1) | 157 | 25 | 182 |
| Half cut (n = 2) | 157 | 2 | 79.5 |
| Half cut (n = 2) | 157 | 5 | 81 |
| Half cut (n = 2) | 157 | 10 | 83.5 |
| Half cut (n = 2) | 157 | 25 | 91 |
| Quarter cut (n = 4) | 157 | 2 | 39.75 |
| Quarter cut (n = 4) | 157 | 5 | 40.5 |
| Quarter cut (n = 4) | 157 | 10 | 41.75 |
| Quarter cut (n = 4) | 157 | 25 | 45.5 |
| Sixth cut (n = 6) | 157 | 2 | 26.5 |

TABLE 2-continued

Examples of Cell Dimensions.

| Cell cuts | W (mm) | X (mm) | L (mm) |
|---|---|---|---|
| Sixth cut (n = 6) | 157 | 5 | 27 |
| Sixth cut (n = 6) | 157 | 10 | 27.83 |
| Sixth cut (n = 6) | 157 | 25 | 30.33 |

Figures 12, 13:
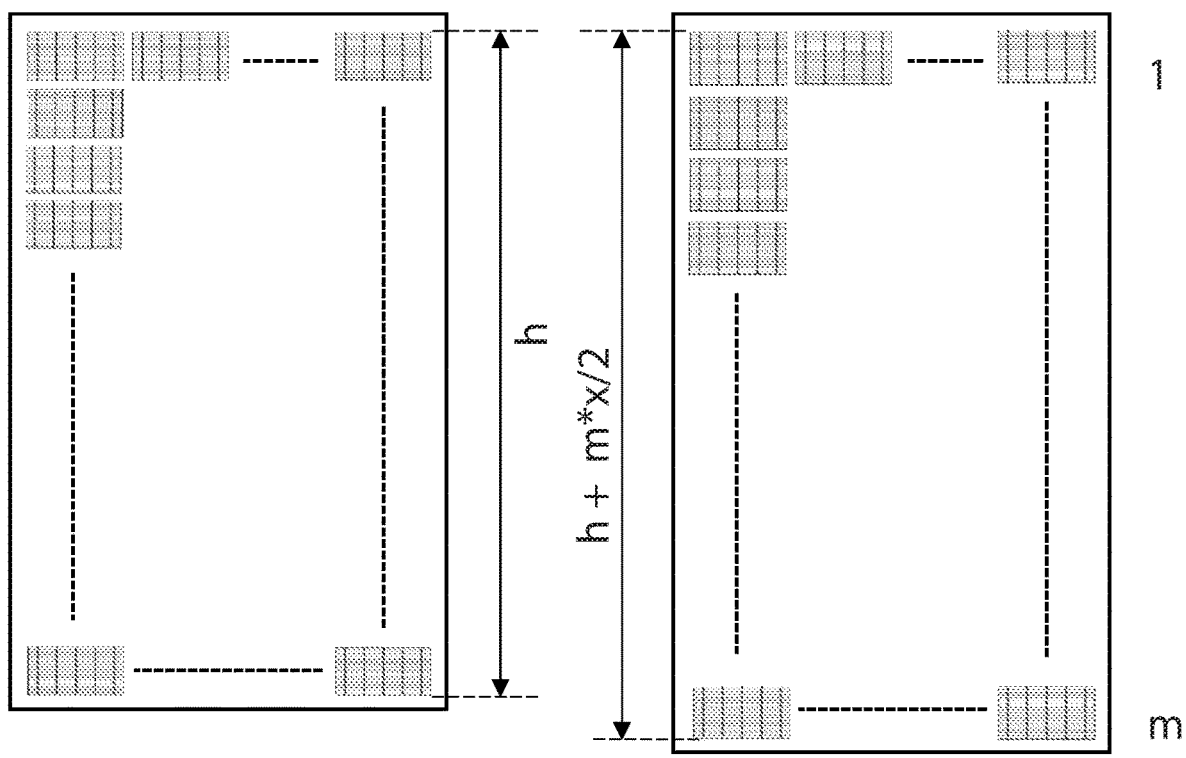
FIG. 12 (Prior Art) shows a module composed of, industry standard square wafers associated together, where the cells are half cut (n=2); there are m half cut cells in each module; the length of the cell area is h.
FIG. 13 shows a module of an embodiment of the invention hereof, composed of wafers of an aspect of the invention hereof, associated together, where the cells are half cut (n=2); there are m half cut cells in each module; this results in a module of the same width, but the module of this embodiment is longer than h.

FIG. 12 shows a module composed of conventional, industry standard square wafers associated together, where the cells are half cut (n=2). There are m half cut cells in each module. The length of the cell area is h and is equal to w*m, where m is the number of half cut cells in the module.

FIG. 13 shows a module of an embodiment of the invention, composed of wafers of an aspect of the invention, associated together, where the cells are half cut (n=2). There are m half cut cells in each module. This results in a module of the same width, but the module of this embodiment of the invention is longer than a cell area formed by square cells, h, by approximately m*(x/2), where m is the number of half cut cells in the module, and x is the increase in length of a wafer of an invention hereof over the standard A width of w. This assumes that the spacing between cells in a module of an embodiment of the invention is the same as that in a conventional module.

To a first order, the increase in module power would scale with the cell area, regardless of the number of cuts. Therefore, the increase in module power can be modeled as follows. As an example, for a 72-cell module, increasing the wafer length from A=w, to A=w+x, would increase the active area of the module by 1+x/w, for each wafer. Thus, if A=w=157 mm and x=10 mm, then the increase in area is 1+10/157=1.06. A module made of standard A square wafers has a power output of 340 W. If the standard A square wafers are replaced with an equal number of rectangular 157 mm wide and 167 mm long wafers, a module would produce 362 Watts. A less pronounced larger wafer size would be x=2 mm, which would increase the area and power output to 1.013. Thus, a module composed of the slightly longer wafers would have a power output of 344.3 W, as compared to 340 W.

It is expected that, for an industry standard size A=156 mm, the length could be extended by a value of x equal to approximately 25 mm. This for at least two reasons. Firstly, it is believed that the largest length wafer that can be accommodated in presently used or similar standard cell processing equipment will be defined by the PECVD step, where silicon nitride is applied to the wafers to passivate the surface and to serve as an anti-reflection coating. The equipment uses a tube for the plasma enhanced reaction deposition, and the diameter of these tubes would limit the maximum size of the wafer that is sitting in the carrier boat. It is believed that the maximum increase in wafer length over the standard of 156 mm that could be accommodated is 25 mm.

Secondly, if a standard wafer 157 mm by 157 mm is cut into what is believed to be the maximum practical number of cuts (n=6), the cut cell length would be 157/6 or 26.17 mm. It would be impossible to distinguish between a cut cell coming from a standard 157/6 wafer and a cut cell coming from a direct wafer 183.17 mm cell where n=7. Thus, in the realm of the cut wafers, there would be no advantage to having a longer wafer by more than 25 mm, because the cut wafers would be functionally equivalent to those that could be obtained from normal size wafers, with approximately the same effort. Regarding this potential upper practical limit for the additional length of longer wafers, if the tubes used for PECVD step become larger for independent reasons, or are made larger to accommodate larger, longer wafers, then the upper limit for increased length would be larger, accordingly.

Figure 10:
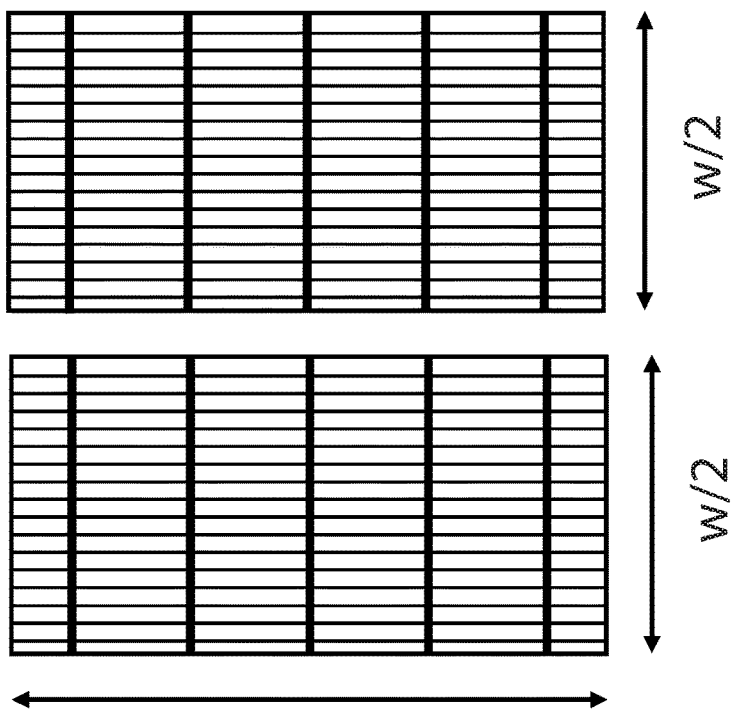
FIG. 10 (Prior Art) shows schematically, the square industry standard A=w by w wafer of FIG. 8, cut to form two smaller wafers, each of width w, which is the industry standard size A, and of length w/2 with current carrying gridlines provided.

Such fractional wafers cut from square wafers are shown schematically in FIG. 10, in which a single wafer is shown having one dimension, a width w (which satisfies the industry standard square A size requirements) and the perpendicular dimension, analogous to what is called the length, above, is shorter, being only w/2 (n=2). Two such half cut wafers are formed from a single square wafer, by cutting it after the electrical conducting gridlines and other conductors have been applied to it.

Figure 11:
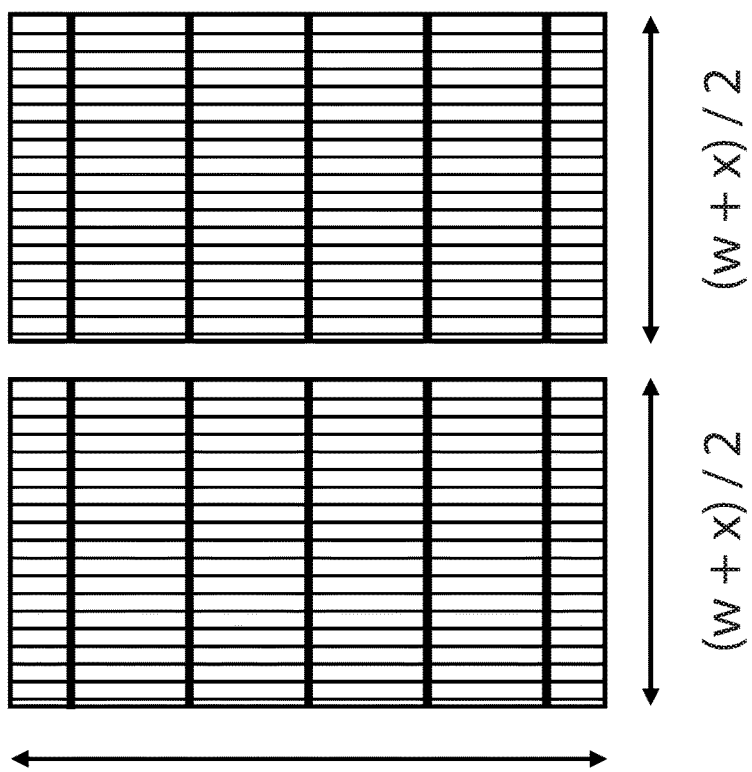
FIG. 11 shows, schematically a wafer of an embodiment of the invention hereof as shown in FIG. 9, with current carrying gridlines, sliced to form two wafers, each of rectangular shape width w and length (w+x)/2.

An aspect of the invention hereof is shown in FIG. 11, which shows two fractional wafers of an embodiment of the invention cut from a rectangular wafer. Each has fractional wafer an industry standard width w (corresponding to the standard A) and a perpendicular length, which is less than w, but greater than w/2. That longer length is (w+x)/2. Thus, it can be seen that the half (or other fractional sized, such as ⅓, ¼, ⅕, ⅙) sized wafer of an aspect of the invention will similarly have more surface area at essentially the same cost, as the half-sized wafers formed from square wafers with sides of size w.

As a result of the longer cells, the module incorporating such longer cells may be required to be longer to accommodate the longer cells. The modules made from cells of the current embodiments of the invention will likely be the same width as square cells, because the cell width will not be any different. Longer modules will require minor changes to the length of the encapsulation material, frame length, front glass, and back cover (either glass or polymer). The costs of increasing or changing module length (if required) will be more than offset by the premium obtained with a higher power module. All current strategies for minimizing area between the cells will apply.

Thus, wafers of aspects of the invention hereof provide more surface area and therefore current for power, without adding almost any cost to cell processing, and only moderate changes to stringer/tabber and module Bill of Materials (BOM).

As an example, consider that for every extra 2 mm in length added to a full sized square standard wafer of side size A (an addition of 1 mm per half-cut cell), the module power will increase by 1.28%. This is 4 Wp for a 330 Wp module. This is shown in the following Table 3. It would make the module 24 mm longer.

TABLE 3

| cell size | 156.75 | mm |
|---|---|---|
| extra length | 2 | mm |
|  | 1.28% |  |
| module power | 330 | Wp |
| additional module power | 4.21 | Wp |

Figure 5:
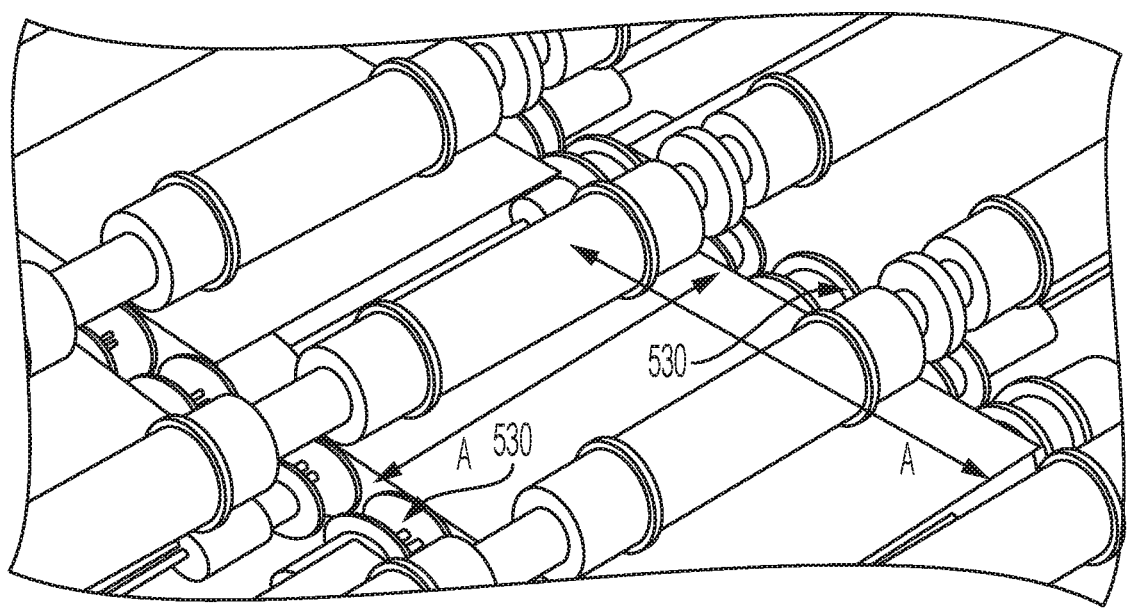
FIG. 5 (Prior Art) shows, schematically, rollers in a typical wet bench stage, with which square wafers of the industry standard size A in width are required to fit within the guide collars, and are moved along in the perpendicular direction.

Thus, any processing and handling steps that involve planar support by belts, such as the inspection system shown in FIG. 3 can accommodate longer wafers. Some steps, or sometimes between steps, require that handled wafers are placed in edge support carriers such as that shown in FIG. 4. Edge supporting carriers or cassettes such as these require the standardized width specification to be met, but can allow longer wafers. Similarly, handling apparatus such as wet bench, planar supporting transport rollers, such as that shown in FIG. 5 also require the standardized width specification to be met so that the wafer will fit between the guide collars, but a wafer of longer length is accommodated.

Although there will be some changes to the automation and detection systems to account for the longer wafers, these changes will be minimal and not require massive capital retooling and expenditure.

However, because the Direct Wafer technology process grows or forms wafers one at a time, without a requirement that the wafers be square, or symmetrical, or actually, any specific shape, using it, a designer can create a wafer that meets the SEMI standard for width A, but exceeds the SEMI standard for width A in the perpendicular dimension, thus having a longer length. In that manner, larger, rectangular wafers can be made and, surprisingly, rectangular wafers can be conveniently handled and manipulated in standard solar wafer and module processing equipment designed for square wafers.

A wafer designer of ordinary skill in the art is conditioned to think in terms of square wafers only. That is the industry standard. That is the only wafer that is commercially made and sold. All of the wafer processing equipment is designed to hold the square wafers, and when making the wafers, it is important that they be, in fact, square, so that the module makers need not keep track of what orientation the wafers are in as they move through the process. In fact, if a wafer does not meet the standard for square-ness embodied in the industry standard set forth above, it is rejected and not used.

Thus, although the Direct Wafer making process is not limited to making square wafers, it has always and only been done to do so.

It was a surprising insight to realize that non-square wafers could both be used, relatively conveniently in conventional equipment designed for and exclusively used for processing and handling square wafers of the Standard size A size and shape, and then also to realize that such non-square wafers could, in fact, be made using the Direct Wafer technology process without undue expense or waste or need to modify the basic principles of the technology. Only the shape of the mold, and surrounding accessory equipment needs to be altered, or the finally cut shape needs to be changed, with any trimmed scraps being recycled and reused.

Thus, aspects of the invention hereof include but are not limited to wafers that are industry standard size width A, and a length that is longer than A, in this case A=w=156 mm. In some embodiments, the additional length x can be any length desired between 3 mm and 25 mm, as discussed above, or longer if the tubes for PECVD steps are made larger. In some embodiments, inventions hereof also include cells made using such larger wafers, and modules using such cells using such larger wafers. Additional embodiments include wafers that are industry standard width A=w=156 mm wide, and a length that is an integral fraction of a longer length, w+x, such as (w+x)/2; (w+x)/3; (w+x)/4; etc., and cells and wafers made with such fractional longer wafers. Yet another group of embodiments are methods of using standard wafer processing and handling equipment that is designed to be used with industry standard sized square width A=w=156 mm wafers, to handle wafers that are industry standard width A=w=156, but that are longer than w by an amount x, with x ranging from 3 mm to 25 mm, or longer, as discussed above. The method of using such standard equipment is to position the width=A, length=longer than A wafers in the carrier with their width constrained in the one dimension of the equipment that is, in fact constrained, such as the distance between rollers or guide walls or rails equal to A, and with the longer dimension extending outward, beyond the normal location that a square wafer of side lengths=A would extend.

At least one advantage of the invention is that the same cell and module processing and handling operations can be utilized with a rectangular wafer that meets the industry standard for width, but is longer than standard. This has been not apparent to PV wafer manufacturers because of the difficulty and economic waste of making rectangular wafers using a symmetric source. Although there will be some changes to the automation and detection systems to account for the longer wafers, these changes will be minimal and not require massive capital retooling and expenditure. Thus, another embodiment is a method of using such industry standard equipment sized to handle square wafers of a side A=w, with rectangular wafers that instead have one side of size A=w, and one longer side of w+x, however that may be accommodated, for instance as shown in FIGS. 14, 15 and 16, with the longer side arranged so as not to interfere with other hardware.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

The invention claimed is:

1. A method of handling a rectangular semiconductor wafer, the method comprising:
   a. providing the rectangular semiconductor wafer having a first edge having a width size w equal to industry standard size A, and a second edge having a length size L that is larger than the size of the first edge, such that L equals A+x, where x is at least three mm;
   b. providing a semiconductor wafer processing apparatus sized to handle and process industry standard size A square wafers, the semiconductor wafer processing apparatus having a wafer retaining portion sized to retain a square wafer having a first edge having a width size w equal to industry standard size A and having a configuration that also accommodates said square wafer with a second edge having a length size L, wherein wafer retaining portion has a first dimension and a second dimension at an area in which said square wafer is retained, the first dimension perpendicular to the second dimension, and wherein the wafer retaining portion is configured such that the wafer retaining portion is size constrained along the first dimension and is not size constrained along the second dimension; and c. providing the rectangular semiconductor wafer to the wafer retaining portion of the semiconductor wafer processing apparatus such that the first edge of the rectangular semiconductor wafer having width size w is retained in the wafer retaining portion, and such that the second edge of the rectangular semiconductor wafer having length size L is also accommodated, wherein the rectangular semiconductor wafer is oriented in the area such that the first edge of the rectangular semiconductor wafer having width size w is parallel to the first dimension and the second edge of the rectangular semiconductor wafer having length size L is parallel to the second dimension; and d. performing a wafer processing operation on the rectangular semiconductor wafer using the semiconductor wafer processing apparatus.

2. The method of claim 1, wherein the semiconductor wafer processing apparatus comprises an edge support apparatus.

3. The method of claim 1, wherein the semiconductor wafer processing apparatus comprises a planar support apparatus.

4. The method of claim 1, further comprising, prior steps c and d:
providing the square wafer to the wafer retaining portion of the semiconductor wafer processing apparatus; and
performing the wafer processing operation on the square wafer using the semiconductor wafer processing apparatus.

5. The method of claim 1, further comprising, prior to step a:
providing a melt of semiconductor material;
applying a pressure differential across a porous mold sheet and forming the rectangular semiconductor wafer on the porous mold sheet from the melt of semiconductor material by contacting the porous mold sheet a surface of the melt of semiconductor material; and
reducing the pressure differential to remove the rectangular semiconductor wafer from the porous mold sheet.

6. The method of claim 2, wherein:
the rectangular semiconductor wafer has a third edge having the length size L, the third edge of the rectangular semiconductor wafer is located opposite the second edge of the rectangular semiconductor wafer and the second and third edges of the rectangular semiconductor wafer are each perpendicular to the first edge of the rectangular semiconductor wafer;
the edge support apparatus has a bottom support and two edge rails; and
providing the rectangular semiconductor wafer to the wafer retaining portion of the semiconductor wafer processing apparatus such that the first edge of the rectangular semiconductor wafer having width size w is retained in the wafer retaining portion, and such that the second edge of the rectangular semiconductor wafer having length size L is also accommodated comprises providing the rectangular semiconductor wafer to the wafer retaining portion of the semiconductor wafer processing apparatus such that the first edge of the rectangular semiconductor wafer having width size w is retained in the wafer retaining portion by the bottom portion and such that each of the second edge and the third edge of the rectangular semiconductor wafer having length sizes L are respectfully retained by one of the two edge rails.

7. The method of claim 6, wherein:
the rectangular semiconductor wafer has a fourth edge opposite the first edge of the rectangular semiconductor wafer and the second and third edges of the rectangular semiconductor wafer are each perpendicular to the fourth edge of the rectangular semiconductor wafer; and
the edge support apparatus is configured such that the fourth edge of the rectangular semiconductor wafer is unconstrained when the rectangular semiconductor wafer is provided to the wafer retaining portion of the semiconductor wafer processing apparatus.

8. The method of claim 3, wherein:
the planar support apparatus comprises belts or rollers that contact the rectangular semiconductor wafer during the wafer processing operation and move the rectangular semiconductor wafer in a direction of travel during the wafer processing operation; and
providing the rectangular semiconductor wafer to the wafer retaining portion of the semiconductor wafer processing apparatus such that the first edge of the rectangular semiconductor wafer having width size w is retained in the wafer retaining portion, and such that the second edge of the rectangular semiconductor wafer having length size L is also accommodated comprises providing the rectangular semiconductor wafer to the wafer retaining portion of the semiconductor wafer processing apparatus such that the first edge of the rectangular semiconductor wafer having width size w is retained in the wafer retaining portion, and such that the second edge of the rectangular semiconductor wafer having length size L is also accommodated and the second edge of the rectangular semiconductor wafer having length size L is parallel to the direction of travel.

* * * * *